United States Patent
Kang et al.

(10) Patent No.: US 8,533,542 B2
(45) Date of Patent: Sep. 10, 2013

(54) METHOD FOR INTERLEAVING CONTINUOUS LENGTH SEQUENCE

(75) Inventors: Seung Hyun Kang, Anyang-Si (KR); Min Seok Oh, Anyang-Si (KR); Ki Hyoung Cho, Anyang-Si (KR); Young Seob Lee, Anyang-Si (KR); Ji Wook Chung, Anyang-Si (KR)

(73) Assignee: LG Electronics Inc., Seoul (KR)

( * ) Notice: Subject to any disclaimer, the term of this patent is extended or adjusted under 35 U.S.C. 154(b) by 922 days.

(21) Appl. No.: 12/446,792

(22) PCT Filed: Oct. 24, 2007

(86) PCT No.: PCT/KR2007/005251
§ 371 (c)(1),
(2), (4) Date: Apr. 23, 2009

(87) PCT Pub. No.: WO2008/051019
PCT Pub. Date: May 2, 2008

(65) Prior Publication Data
US 2010/0023844 A1    Jan. 28, 2010

(30) Foreign Application Priority Data
Oct. 24, 2006  (KR) .................. 10-2006-0103483

(51) Int. Cl.
*G06F 11/00*    (2006.01)

(52) U.S. Cl.
USPC ........................................... 714/701

(58) Field of Classification Search
USPC .................................. 714/701, 752
See application file for complete search history.

(56) References Cited

U.S. PATENT DOCUMENTS

| | | | | |
|---|---|---|---|---|
| 6,480,475 | B1 * | 11/2002 | Modlin et al. | 370/294 |
| 6,772,377 | B2 * | 8/2004 | Chow | 714/701 |
| 7,827,473 | B2 * | 11/2010 | Lee et al. | 714/794 |
| 8,065,587 | B2 * | 11/2011 | Shen et al. | 714/755 |
| 2003/0237030 | A1 * | 12/2003 | Chun | 714/701 |
| 2004/0255217 | A1 | 12/2004 | Garrett et al. | |
| 2006/0153285 | A1 | 7/2006 | Modlin | |

(Continued)

FOREIGN PATENT DOCUMENTS

| | | |
|---|---|---|
| JP | 11-191757 A | 7/1999 |
| KR | 10-2001-0015765 A | 2/2001 |
| WO | 2006/069392 A1 | 6/2006 |

OTHER PUBLICATIONS

3rd Generation Partnership Project, "Technical Specification Group Radio Access Network; Multiplexing and channel coding (FDD)(Release 1999)," 3G TS 25.212 v3.3.0, Jun. 2000, pp. 1-62, XP002202956.

Berrou et al., "Designing good permutations for turbo codes: towards a single model," IEEE Communications Society, pp. 341-345, XP010710014.

(Continued)

*Primary Examiner* — Yolanda L Wilson
(74) *Attorney, Agent, or Firm* — Birch, Stewart, Kolasch & Birch, LLP

(57) ABSTRACT

An interleaver provision method for providing a continuous length, an interleaving method, and a turbo-encoder thereof are disclosed. The interleaving method selects a basic interleaver having a proper length from among the basic interleaver set, which is predetermined to have the length represented by a multiple of the ARP fluctuation vector period. The interleaving method performs the dummy insertion and the pruning process to have the length acting as the basic-interleaver length, so that it can provide the ARP interleaver having a continuous length.

5 Claims, 9 Drawing Sheets

(56) References Cited

U.S. PATENT DOCUMENTS

2006/0156199 A1* 7/2006 Palanki et al. ............... 714/776
2006/0282713 A1* 12/2006 Weng et al. ................... 714/701
2008/0086674 A1* 4/2008 Shen et al. .................... 714/755
2008/0276138 A1* 11/2008 Flynn et al. ................... 714/701

OTHER PUBLICATIONS

Masera et al., "Low-Cost IP-blocks for UMTS turbo decoders," Proceedings of the European Solid State Circuits Conference, Jan. 1, 2001, 4 pages, XP002287755.

* cited by examiner

US 8,533,542 B2

METHOD FOR INTERLEAVING CONTINUOUS LENGTH SEQUENCE

TECHNICAL FIELD

The present invention relates to a wireless communication technology, and more particularly to a method for providing an interleaver supporting a continuous length, an interleaving method, and a turbo-encoder thereof.

BACKGROUND ART

FIG. 1 is a block diagram illustrating a turbo-encoder.

If two recursive symmetric convolution (RSC) codes are parallel-concatenated by an interleaver, the turbo-code (TC) is formed. In more detail, turbo code can be formed by combining a parity bit ($Y_1$) generated by encoding an input data (X) of the turbo-encoder shown in FIG. 1 by a first RSC construction encoder ($ENC_1$) 101 and the other parity bit ($Y_2$) generated by encoding the input data (X) by a second RSC construction encoder ($ENC_2$) 103.

The longer the minimum hamming distance (MHD), the higher the turbo-code (TC) performance. The MHD may be denoted by the number of bits having different information at neighboring positions among individual sequences.

Generally, if a sequence "000 . . . " is used as a reference sequence, the MHD may be denoted by the number of bits different from the reference sequence. As a result, the MHD may be denoted by the number of weights (i.e., the number of "1") contained in individual sequences. Therefore, the MHD performance is affected by a specific action which prevents the same information from being located at the neighboring positions of sequences applied to the first and second RSC construction encoders 101 and 103. This performance is under the control of the interleaver 102.

FIG. 1 exemplarily shows an interleaver based on a regular rectangular permutation. The interleaver of FIG. 1 applies an appropriate permutation to a sequence of the length "k", records the resultant sequence in a row direction of a rectangular matrix of M×N bits, and reads the recorded sequence in the column direction.

A detailed description of the interleaver shown in FIG. 1 is shown in FIG. 2.

FIG. 2 exemplarily shows a method for performing a regular permutation (RP).

The RP method of FIG. 2 writes a sequence in the row direction according to the above-mentioned regular rectangular permutation (RRP), reads the sequence in the column direction, and outputs the resultant sequence. For the convenience of description, the numbers written in the matrix in FIG. 2 are equal to the index (i) of the input sequence.

Generally, the relationship between the index of the input sequence in the RP and the other index (j) of the output sequence can be represented by the following equation 1, so that the index (i) and the other index (j) can be mapped to each other by Equation 1:

$$i = \Pi(j) = P \cdot j [\bmod K] \quad \text{[Equation 1]}$$

In Equation 1, "K" is the size of the interleaver. "P" and "K" are mutually-disjointed integers, and correspond to the numbers of columns of FIG. 2. Based on the above-mentioned mapping relationship, FIG. 2 shows the index mapping process executed by $i=\Pi(j)=7 \cdot j[\bmod 32]$ under K=32 and P=7.

The input sequence (I) having the length of 32 bits is recorded in the row direction according to the above-mentioned index mapping relationship, and is then read in the column direction, so that it is changed to an output sequence (I').

In the meantime, the RSC sequence may include a RTZ (Return-To-Zero) sequence which reduces the weight of a codeword. The RTZ sequence enables the construction encoder to output a specific sequence in which the value "0" is repeated, so that the weight of the output sequence is decreased.

In more detail, as shown in FIG. 1, provided that the input sequence of the first RSC construction encoder 101 is set to a sequence (I), and a predetermined RTZ sequence exists in the sequence (I), the weight of the parity bit ($Y_1$) created by the first RSC construction encoder 101 becomes lower.

A sequence interleaved by the interleaver 102 is applied to the second RSC construction encoder 103. If this sequence received in the second RSC construction encoder 103 is called a sequence (I'), and the interleaved sequence (I') also includes the RTZ sequence, the weight of the parity bit ($Y_2$) created by the second RSC construction encoder 103 becomes lower, so that the MHD of the whole codeword becomes lower. Therefore, the interleaver 102 must be designed not to generate the RTZ sequence in the sequence (I') received in the second RSC construction encoder 103.

FIG. 3A shows an example of the RTZ (Return-To-Zero) sequence having the weight "2". FIG. 3B shows an example of the RTZ (Return-To-Zero) sequence having the weight "3". FIG. 3C shows an example of the RTZ (Return-To-Zero) sequence having the weights "6" and "9".

In more detail, the RTZ sequence having the weight "2" is shown in FIG. 3A. Referring to FIG. 3A, the input sequence (I) includes the RTZ sequence in which the bit "1" is spaced apart from the other bit "1" by a predetermined distance corresponding to 7 bits. And, FIG. 3A shows the interleaving based on the above-mentioned regular rectangular permutation (RRP) in which the input sequence (I) is recorded in the row direction and is then read in the column direction.

In the case of the RTZ sequence having the weight "2" as shown in FIG. 3A, the MHD ($d_{min}$) can be represented by the following equation 2:

$$d_{min} \approx 7M/2 \quad \text{[Equation 2]}$$

In Equation 2, the number "7" is 7 bits indicating to the distance between two "1" values in the input sequence (I), M is the number of rows in the M×N matrix, and the number "2" is the number of the values "1" indicating the last bits of individual sequences. As can be seen from FIG. 3A, the MHD ($d_{min}$) gets closer to "7M/2".

FIG. 3B shows an example of the RTZ (Return-To-Zero) sequence having the weight "3". In more detail, FIG. 3B shows an example of the RTZ (Return-To-Zero) sequence in which three "1" values (e.g., . . . 1101 . . . ) are arranged in the input sequence (I).

In the case of the RTZ sequence having the weight "3" as shown in FIG. 3B, the MHD ($d_{min}$) can be represented by the following equation 3:

$$d_{min} \approx 3M/2 \quad \text{[Equation 3]}$$

In Equation 3, the number "3" is 3 bits indicating to the distance between the last bits "1" in the input sequence (I), M is the number of rows in the matrix, and the number "2" is the number of the values "1" indicating the last bits of individual sequences. As can be seen from FIG. 3B, the MHD ($d_{min}$) gets closer to "3M/2".

In the case of applying the regular permutation (RP) to the RTZ sequence in FIGS. 3A and 3B, the longer the length "K"

of a total sequence, the higher the value ($d_{min}$), thereby preventing the RTZ sequence from being contained in the output sequence (I).

In the meantime, FIG. 3C exemplarily shows the RTZ sequence having the weights "6" and "9". In the case of this RTZ sequence of FIG. 3C, the MHD cannot be generally defined, and varies with a specific pattern of the corresponding sequence.

The input sequence (I) of FIG. 3C includes the RTZ sequence ( . . . 1101 . . . ) in the input sequence arranged in the column direction, and includes the other RTZ sequence ( . . . 100001 . . . ) in the output sequence arranged in the row direction.

If the RTZ sequence is contained in the input sequence (I) having the weights "6" and "9" by the interleaving based on the RP, it can be recognized that the performance that the RTZ sequence is not contained in the output sequence (I) may be deteriorated.

Therefore, there has been widely used an almost regular permutation (ARP) causing the disorder while the RTZ sequence is read in the column direction of the interleaver memory matrix. The ARP can maintain the RP characteristics having a good performance associated with the other RTZ sequence of FIG. 3A or 3B, and can prevent the RTZ sequence of FIG. 3C from being generated.

In brief, the ARP is acquired by adding fluctuation vectors to the RP. In more detail, the above-mentioned RP cannot avoid the RTZ sequence having the weight "6" or "9" in the interleaving process. In order to prevent the RTZ sequence having the weight "6" or "9" from being generated in the interleaving process, the disorder must be encountered in the RP, so that the above-mentioned fluctuation vectors are added to the RP to encounter the disorder in the RP.

Presently, the ARP has been widely used as a turbo-code interleaver of DVB-RCS, DVB-RCT, and IEEE 802.16. A variety of applications of the above-mentioned ARP have been described in "ETSI EN 301 790 v1.2.2(2000-12)" and "Draft IEEE standard Local and Metropolitan area networks, Part 16".

FIG. 4 is a conceptual diagram illustrating the almost regular permutation (ARP) based on the fluctuation vectors.

The ARP can be represented by the following index mapping relationship of Equation 4, so that it can encounter the disorder in the recording/reading process by adding the fluctuation vectors to the RP using the following Equation 4:

$$i=\Pi(j)=P\cdot j+Q(j)\bmod K \quad \text{[Equation 4]}$$

In Equation 4, Q(j) is indicative of the fluctuation vector. And, the fluctuation vector Q(j) can also be represented by the following equation 5:

$$Q(j)=A(j)\cdot P+B(j)=C(\alpha(j)\cdot P+\beta(j)) \quad \text{[Equation 5]}$$

In Equation 5, "C" is indicative of a disorder period, "A(j)" or "B(j)" is indicative of a periodic function having the period (C), and "P" is equal to or less than 20% of the value "K/P". Also, "Q(0)" may be set to "0", and the ARP can be defined by both "2(C−1)" number of integers (i.e., 2(C−1) integers) defining the values A(j) and B(j) and the value "P".

FIG. 4 shows a variety of processes encountered while the sequence is recorded or read by the above-mentioned fluctuation vector. Detailed description of the encountered processes has been disclosed in "Designing Good Permutations for Turbo-codes: Towards a Single Model" written by C. Berrou, and Y. Saouter et al.

In order to reduce the number of interleaver parameters defining the above-mentioned ARP, a specific ARP capable of satisfying the following conditions 1), 2), and 3) can be proposed as follows:

1) the ARP must apply a single value, which is set to any one of the remaining values other than "0";

2) A(j)' and B(j)' exist in the ARP, in which each of A(j)' and B(j)' is a multiple of "C"; and 3) α(j) and β(j) are integers between "0" and "8", and each of α(j) and β(j) is set to a multiple of "C".

A detailed application example of the above-mentioned ARP is as follows.

In more detail, the left part of FIG. 5 shows the index mapping relationship based on the RP satisfying P=7 and K=32 in the same manner as in FIG. 2, and the right part of FIG. 5 shows that the mapping relationship based on the above-mentioned RP is represented by the fluctuation vector Q(j) as shown in FIG. 6.

$$i=\Pi(j)=P\cdot j+Q(j)\bmod K=7\cdot j+Q(j)\bmod 32 \quad \text{[Equation 6]}$$

In Equation 6, Q(j) can be represented by the following Equation 7:

$$Q(j) = C(\alpha(j)\cdot P + \beta(j)) \quad \text{[Equation 7]}$$

$$= \begin{cases} 0, & \text{if } j = 0\bmod 4 \\ 4\cdot 1, & \text{if } j = 1\bmod 4 \\ 4\cdot 1\cdot 7 + 4\cdot 3, & \text{if } j = 2\bmod 4 \\ 4\cdot 1\cdot 7 + 4\cdot 4, & \text{if } j = 3\bmod 4 \end{cases}$$

In the case of the disorder encountered in a first-column directional mapping process in the RP index mapping relationship shown in the left side of FIG. 5, j=0 is mapped to i=0, j=1 is mapped to i=11 instead of i=7, j=2 is mapped to i=22 instead of i=14, and j=3 is mapped to i=1 instead of i=21, as shown in the right side of FIG. 5.

However, the above-mentioned fluctuation vector Q(j) is a function having the period "C", so that the interleaver size "K" (i.e., the length "K" of the interleaving information) must be set to a multiple of "C". In other words, the above-mentioned example in which the period C is set to "4" can provide only the interleaver having the length denoted by a multiple of "4", so that there is needed an improved technology capable of providing the interleaver having a continuous length simultaneously while using the ARP.

SUMMARY OF THE INVENTION

Accordingly, the present invention is directed to a method for interleaving a continuous-length sequence that substantially obviates one or more problems due to limitations and disadvantages of the related art.

An object of the present invention is to provide a method for interleaving a continuous-length sequence using an interleaver which can interleave only a sequence having the length represented by a multiple of a specific-length value.

Another object of the present invention is to provide a method for providing an interleaver which uses the ARP simultaneously while having the length not represented by a multiple of the fluctuation-vector period "C".

Still another object of the present invention is to provide a basic interleaver concept, an interleaving method based on the pruning concept, and a turbo-encoder including an interleaver capable of performing the basic interleaver concept and the pruning concept.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an interleaving method comprising: inserting dummy information in an index of an original sequence by a predetermined length corresponding to a difference in length between a basic interleaver selected from among a basic interleaver set and the original sequence; interleaving the dummy information inserted sequence having the length of the selected basic interleaver using the selected basic interleaver; and outputting the interleaved sequence corresponding to the index not having the dummy information from among indexes of the interleaved sequence, wherein the selected interleaver is selected from among at least one interleaver having a length represented by a multiple of a specific length, and the dummy information in the inserting the dummy information is inserted in an arbitrarily-selected position between the original sequences.

Preferably, the arbitrary-selected position in which the dummy information is inserted includes an initial position of the original sequence.

Preferably, the length of the selected basic interleaver is a minimum length among lengths which are equal to or longer than the length of the original sequence, and which are represented by the multiple of the specific length.

Preferably, the method further comprises: mapping the index of the outputted sequence according to the index of the original sequence, after the outputting the interleaved sequence.

Preferably, the basic interleaver set is pre-designed to have a length represented by a multiple of an ARP (Almost Regular Permutation) fluctuation-vector period.

Preferably, the specific length is equal to a length of the ARP fluctuation-vector period.

It is to be understood that both the foregoing general description and the following detailed description of the present invention are exemplary and explanatory and are intended to provide further explanation of the invention as claimed.

The present invention uses the interleaver having the length corresponding to a multiple of a specific length, and at the same time interleaves the sequence having a continuous length.

Specifically, the present invention performs the pruning process on a predetermined basic interleaver having the length represented by a multiple of the period of the ARP fluctuation vector, so that it can provide the ARP interleaver having a continuous length although the length denoted by the above-mentioned fluctuation-vector period has not been established.

Also, the present invention provides the basic interleaver concept, the interleaving method based on the pruning concept, and the turbo-encoder equipped with the interleaver executing the interleaving method, so that it can perform the ARP having a continuous length without generating additional overheads.

DESCRIPTION OF DRAWINGS

The accompanying drawings, which are included to provide a further understanding of the invention, illustrate embodiments of the invention and together with the description serve to explain the principle of the invention.

In the drawings:

FIG. 2 exemplarily shows a method for performing a regular permutation (RP);

DESCRIPTION OF THE EMBODIMENTS OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Prior to describing the present invention, it should be noted that most terms disclosed in the present invention correspond to general terms well known in the art, but some terms have been selected by the applicant as necessary and will hereinafter be disclosed in the following description of the present invention. Therefore, it is preferable that the terms defined by the applicant be understood on the basis of their meanings in the present invention.

For the convenience of description and better understanding of the present invention, general structures and devices well known in the art will be omitted or be denoted by a block diagram or a flow chart. Wherever possible, the same reference numbers will be used throughout the drawings to refer to the same or like parts.

The present invention provides the basic interleaver concept to solve the problems of the conventional art, incapable of providing the interleaver having a continuous length due to the ARP having a specific period.

However, the following interleaving method based on the basic interleaver according to the present invention is not limited to only the above-mentioned ARP examples, and can also be applied to a variety of conventional interleaving schemes, each of which not only interleaves using the ARP but also interleaves the sequence having a length represented by a multiple of a specific length.

In this case, the basic interleaver has a predetermined length decided to implement a desired interleaver having a required length. Generally, the basic interleaver sets having various lengths may be prescribed if required.

Figure 6:
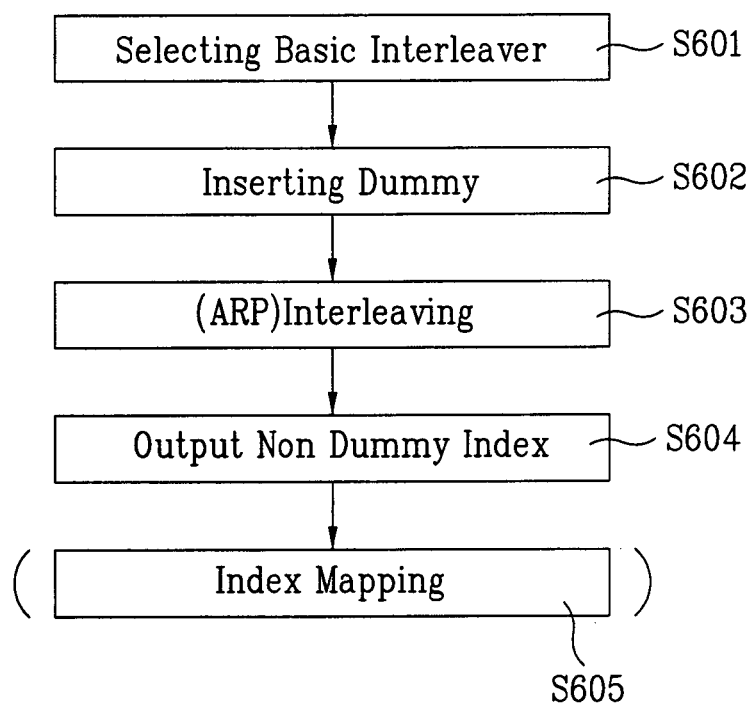
FIG. 6 is a flow chart illustrating a method for providing an interleaver having a continuous length using the basic interleaver concept according to the present invention.

FIG. 6 is a flow chart illustrating a method for providing an interleaver having a continuous length using the basic interleaver concept according to the present invention.

The interleaving method of FIG. 6 selects an interleaver having the length (K') from among basic interleaver sets to provide the interleaver having the length (K) at step-S601.

Figure 5:
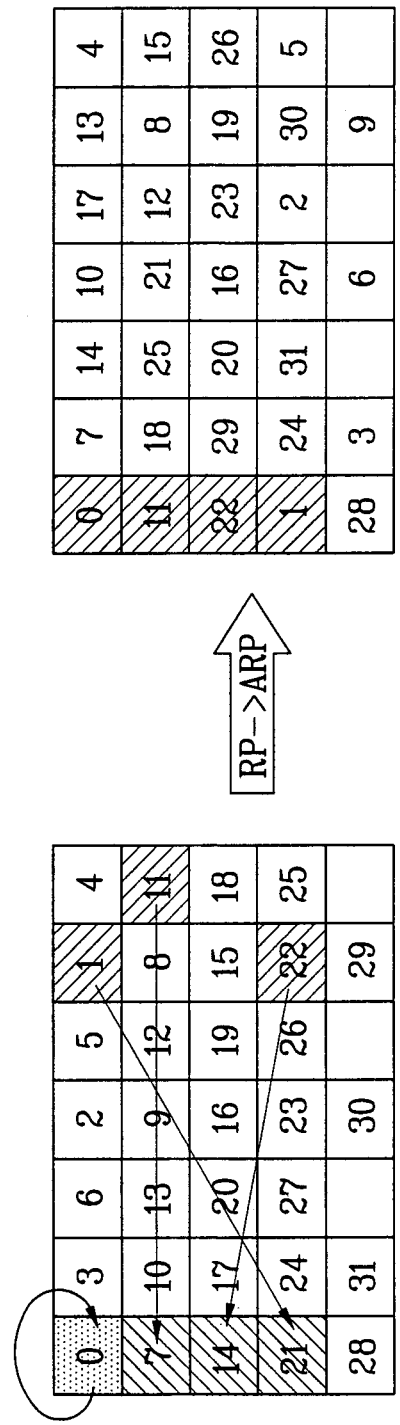
FIG. 5 exemplarily shows a method for performing the ARP of FIG. 4 according to the present invention.

In this case, K' is a multiple of the fluctuation-vector period (C) for implementing the ARP using the concept of FIG. 5, and it is preferable that the basic interleaver having the minimum length K' satisfying K≦K' is selected to facilitate the next pruning process.

Thereafter, if K≦K', the basic interleaver having the length K' selected at step S601 can be adjusted by the interleaver having the length K. This interleaver-length adjustment for each interleaving step will hereinafter be described in detail.

(K'-K) dummy information pieces are inserted in the input sequence of the interleaver at step S602. If the input sequence is B=($b_0$, $b_1$, ..., $b_{k-1}$), (K-K') number of dummy bits are inserted in the input sequence B, so that another sequence B'=($b'_0$, $b'_1$, ..., $b_{k-1}$, $b_k$, $b_{k+1}$, ..., $b_{k'-1}$) is formed.

According to the aforementioned embodiment of the present invention, the position at which dummy information is inserted in the input sequence is set to the part having an index higher than "K". However, according to another embodiment of the present invention, the aforementioned position may be set to another part, and a detailed description thereof will hereinafter be described.

In this way, the dummy information inserted input sequence is adjusted to be the length K', so that the ARP interleaving based on the basic interleaver having the length K' can be conducted at step S603.

If the output sequence which has been ARP-interleaving-completed at step S603 is set to "0", this output sequence can be represented by O=($o_0$, $o_1$, ..., $o_{k'-1}$).

Thereafter, a non-dummy index other than the output-sequence index corresponding to the input-sequence index in which the dummy information is inserted is outputted at step S604.

In more detail, if the relationship between the input-sequence index (i) and the output-sequence index (j) is represented by i=Π(j) at step S603, this indicates that the above-mentioned example outputs the index other than the output index (j) corresponding to i=k, k+1, ..., k'-1. Therefore, only information stored in the position not having the dummy information remains in the output sequence (0').

And, although the above-mentioned embodiment has been disclosed on the basis of a first method for outputting data other than the index equipped with the dummy information, a second method for removing information of the corresponding index from the output sequence according to the relationship $o_j = b_{i=\Pi(j)}$ can also acquire the same result as the first method.

A detailed example of the interleaving method according to the above-mentioned embodiment will hereinafter be described.

Figure 7:
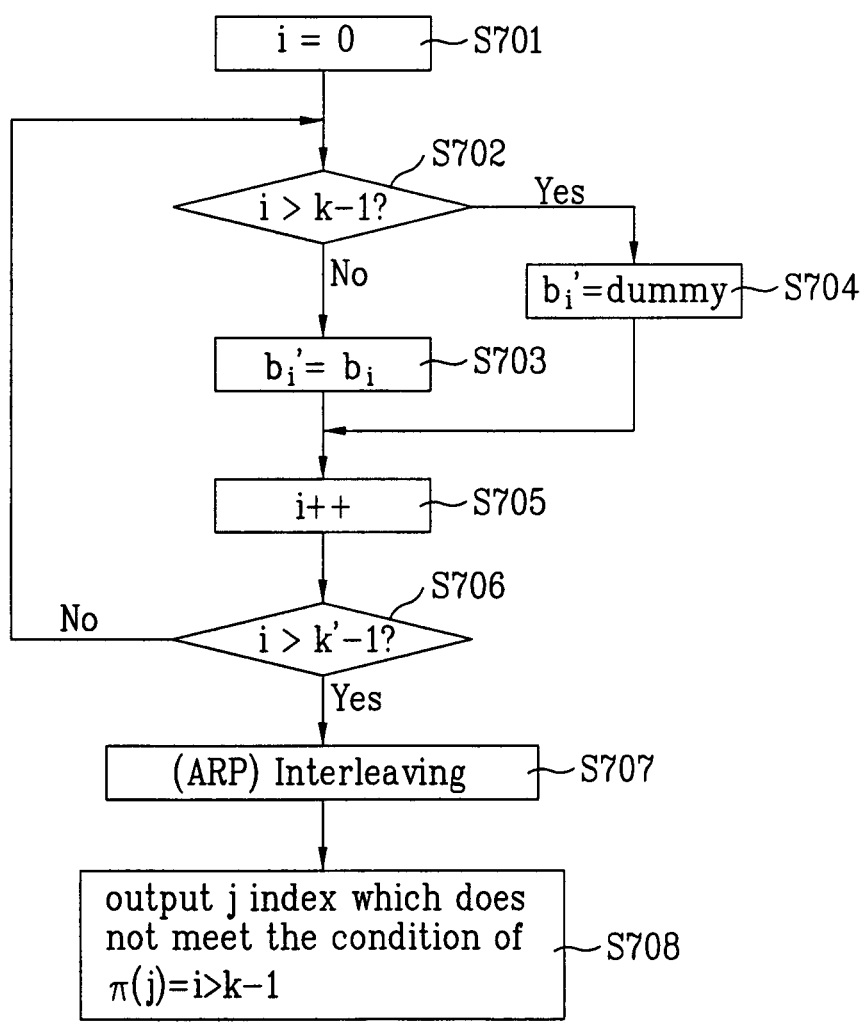
FIG. 7 is a flow chart illustrating an interleaving method according to one embodiment of the present invention.

FIG. 7 is a flow chart illustrating an interleaving method according to one embodiment of the present invention.

The interleaving method of FIG. 7 inserts the dummy information in a terminal of the input sequence, so that it outputs an index other than an index located at the position at which the dummy bit is inserted in the output sequence having been interleaved.

Firstly, the index (i) of the input sequence is initialized to "0" at step S701. Then, the interleaving method of FIG. 7 determines whether the value (i) is equal to or higher than "K" at step S702. If the value (i) is less than "K" at step S702, the interleaving method goes to step S703, so that it matches each information of the input sequence B to each information of the other sequence B' in which the dummy bit is inserted at step S703.

However, if the value (i) is equal to or higher than "K", the interleaving method goes to step S704, so that it inserts the dummy bit in the terminal position of the sequence B' at step S704.

In the meantime, the index (i) of the input sequence sequentially increases at step S705. If the value (i) is less than K', the interleaving method returns to step S702, so that the above-mentioned operations are repeated. For example, if K'=16 and K=14, a dummy value is inserted in each of the value $b_{14}$ of i=14 and the other value $b_{15}$ of i=15.

In the meantime, if the value (i) is equal to or higher than K' at step S706, the interleaving method goes to step S707, so that the ARP interleaving is conducted at step S707. If K'=16 and K=14, the index mapping relationship equation of the ARP interleaving and the fluctuation vector Q(j) can be represented by the following Equation 8:

$$i = \Pi(j) = 7 \cdot j + Q(j) \bmod 16 \quad \text{[Equation 8]}$$

In Equation 8, the fluctuation vector Q(j) can be represented by the following equation 9:

$$Q(j) = C(\alpha(j) \cdot P + \beta(j)) \quad \text{[Equation 9]}$$

$$= \begin{cases} 4 \cdot (0 \cdot 7 + 0), & \text{if } j = 0 \bmod 4 \\ 4 \cdot (1 \cdot 7 + 1), & \text{if } j = 1 \bmod 4 \\ 4 \cdot (1 \cdot 7 + 3), & \text{if } j = 2 \bmod 4 \\ 4 \cdot (1 \cdot 7 + 5), & \text{if } j = 3 \bmod 4 \end{cases}$$

Therefore, the sequence generated by the ARP interleaving of Equations 8 and 9 can be represented by $\Pi_{k'}$={0, 7, 6, 5, 12, 3, 2, 1, 8, 15, 14, 13, 4, 11, 10, 9}.

For the convenience of description, it is considered that individual numbers contained in the aforementioned output sequence indicate indexes of the input sequence. Thereafter, the interleaving method outputs the indexes other than a specific index (j) matched to the index i>K−1 using the relationship Π(j)=i.

In more detail, the sequence generated by the ARP interleaving may be represented by $\Pi_k$={0, 7, 6, 5, 12, 3, 2, 1, 8, 13, 4, 11, 10, 9} having the length K at step S708, and this means that the remaining indexes other than the index (j) corresponding to i=14 and i=15 have been outputted.

Although the above-mentioned embodiment has disclosed that the dummy information is inserted in the terminal of the input sequence, it should be noted that the insertion position of the dummy information is not always limited to the terminal of the input sequence.

The interleaving method according to another embodiment inserts dummy information in (K'-K) indexes located between the input sequences, so that it can conduct the ARP interleaving. In this case, it is assumed that the insertion position of the dummy information includes the initial position of the input sequence. And, the above-mentioned interleaving method according to another embodiment can also include another example in which all of (K'-K) dummy information pieces are inserted in the initial position of the input sequence.

The interleaving method according to the above-mentioned embodiment selects (K'-K) indexes from among input sequence indexes between "0" and "K'-1", and inserts the dummy information in the selected (K'-K) indexes at step S602. The interleaving method outputs an index not having output-sequence index corresponding to the index in which the dummy information has been inserted using the relationship of i=Π(j). So, since the index is removed from the input sequence, the output sequence may further perform mapping the output-sequence index to be suitable for an original-length index.

Figure 8:
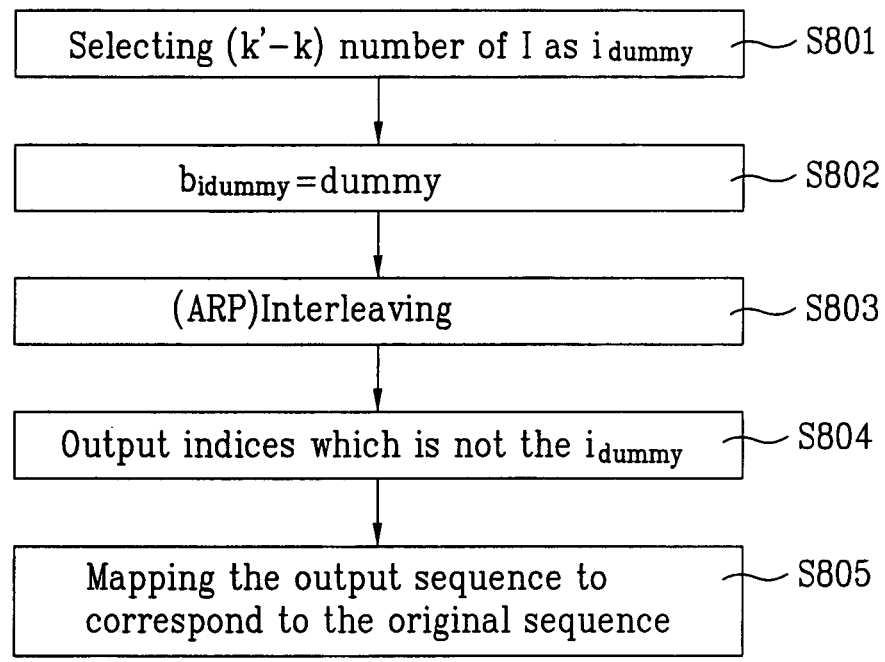
FIG. 8 is a flow chart illustrating an interleaving method according to another embodiment of the present invention.

A detailed description of the above-mentioned embodiment will hereinafter be described with reference to FIG. 8. FIG. 8 is a flow chart illustrating an interleaving method according to another embodiment of the present invention.

Referring to FIG. 8, (K'-K) indexes are selected from among the input-sequence index (i) between "0" and "K'-1" at step S801, and the dummy information is inserted in a corresponding index at step S802.

In more detail, if K'=16 and K=14, the information of i=4 and 10 (where 0≦i≦15) is selected as the dummy-information insertion index. Then, the ARP interleaving of Equations 8 and 9 is conducted at step S803, so that the sequence having the length K' can be represented by $\Pi_{k'}$={0, 7, 6, 5, 12, 3, 2, 1, 8, 15, 14, 13, 4, 11, 10, 9}.

The interleaving method of FIG. 8 outputs the remaining indexes other than an input-sequence index in which the dummy information is inserted, from among the sequence having the length K' at step S804.

For example, if the dummy information is represented by $o_{12}=i_4$ and $o_{14}=i_{10}$, the interleaving method outputs only the remaining indexes other than the corresponding index from among the index (j) of the output sequence. Therefore, the output sequence having the length K' is represented by $\Pi_{pre-mapping\ k'}$={0, 7, 6, 5, 12, 3, 2, 1, 8, 15, 14, 13, 11, 9}. However, it should be noted that the mutual index adjustment between the aforementioned output sequence having the length K' and the other sequence having the length K is needed. For example, the above-mentioned sequence having the length K' may include the indexes 14 and 15 not contained in the input sequence having the length K.

Therefore, the interleaving method of FIG. 8 further includes the step of mapping the index to be suitable for the original input-sequence index at step S805.

As can be seen from the above-mentioned example, the index "5" of the input sequence is mapped to "4", the index "6" of the input sequence is mapped to "5", the index "8" of the input sequence is mapped to "7", the index "9" of the input sequence is mapped to "8", the index "11" of the input sequence is mapped to "9", the index "12" of the input sequence is mapped to "10", the index "13" of the input sequence is mapped to "11", the index "14" of the input sequence is mapped to "12", and the index "15" of the input sequence is mapped to "13". As a result, the output sequence having the final length K can be represented by $\Pi_k$={0, 6, 5, 4, 10, 3, 2, 1, 7, 13, 12, 11, 9, 8}.

Preferably, according to the above-mentioned embodiment, the interleaving method may insert all of the dummy information in the initial position of the input sequence. In more detail, if K'=16 and K=14, two dummy information pieces are inserted into the initial position (i.e., i=0 and 1) of the input sequence. Thereafter, the ARP interleaving based on Equations 8 and 9 is conducted at step S803, so that the interleaving method outputs the sequence having the length K'.

The remaining indexes other than the input-sequence index including the dummy information from among the sequence having the length K' may be generated.

However, it should be noted that the index adjustment among the aforementioned index and the other input sequence having the length K is required. Therefore, the interleaving method may further include the step of mapping the index to be suitable for an index of the original input sequence. Therefore, the output sequence of the final length K may be represented by $\Pi_k$={5, 4, 3, 10, 1, 0, 6, 13, 12, 11, 2, 9, 8, 7}.

According to the above-mentioned embodiment in which the dummy information is inserted in the initial position of the input sequence, considering the aforementioned function in which the other redundant bits inserted in the rate matching process are inserted in the front part of the sequence, the above-mentioned interleaving method has an advantage in that the next original sequence can be easily recovered.

Device characteristics of the turbo-encoder including the interleaving capable of performing the interleaving providing a continuous length will hereinafter be described.

Figure 9:
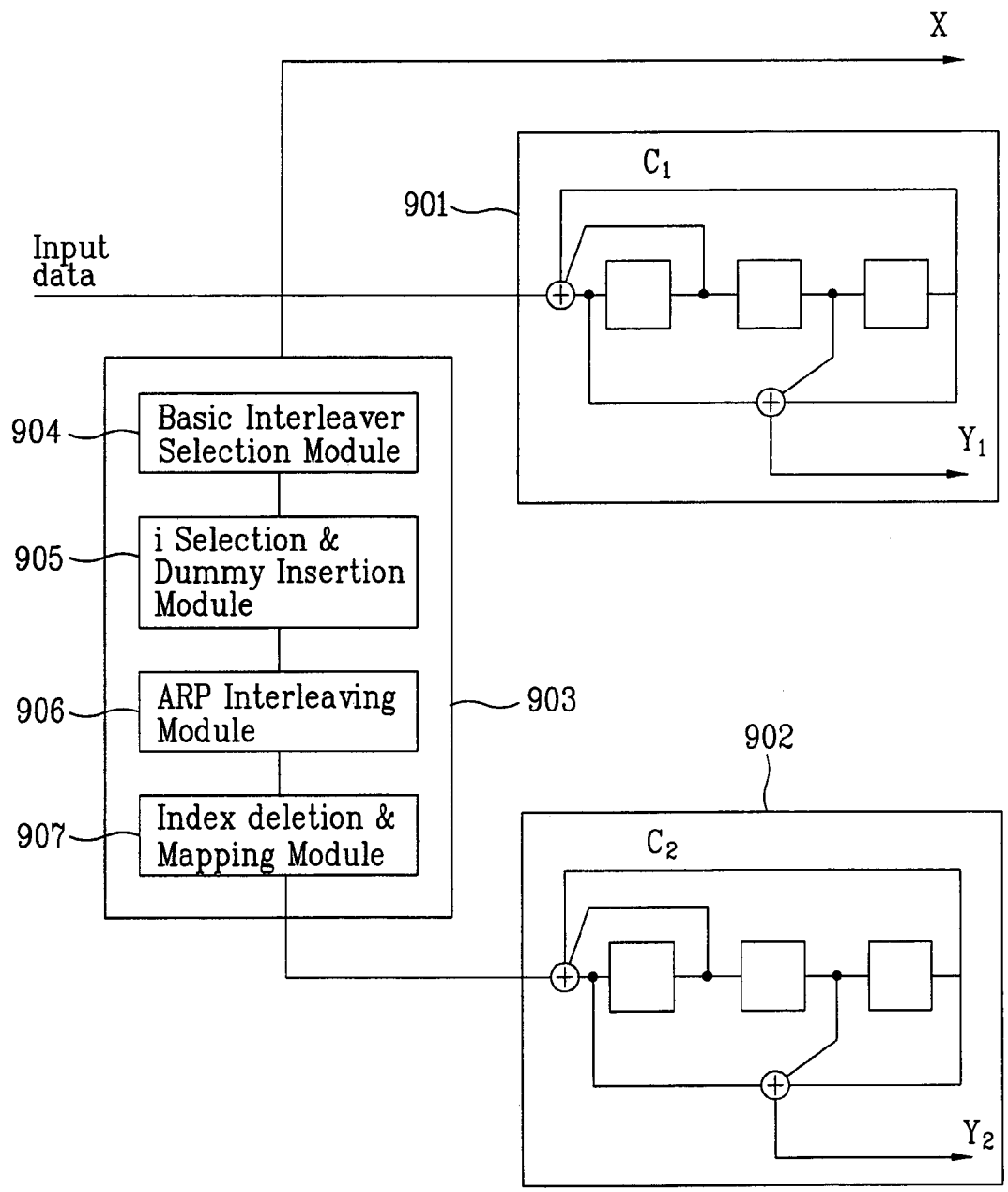
FIG. 9 is a block diagram illustrating a turbo-encoder including the interleaver according to the present invention.

FIG. 9 is a block diagram illustrating a turbo-encoder including the interleaver according to the present invention.

Referring to FIG. 9, the turbo-encoder includes a first construction encoder 901, a second construction encoder 902, and an interleaver 903.

Figure 1:
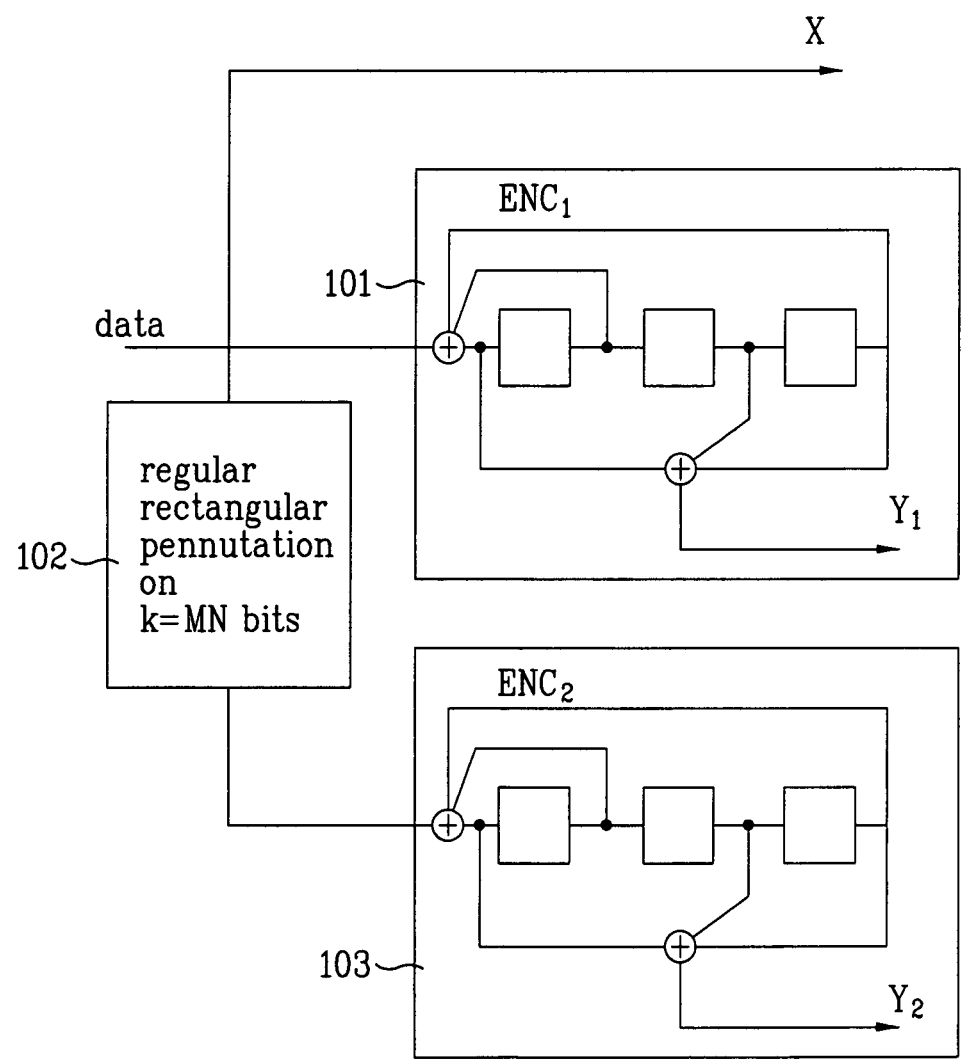
FIG. 1 is a basic block diagram illustrating a turbo-encoder.
Figure 2:
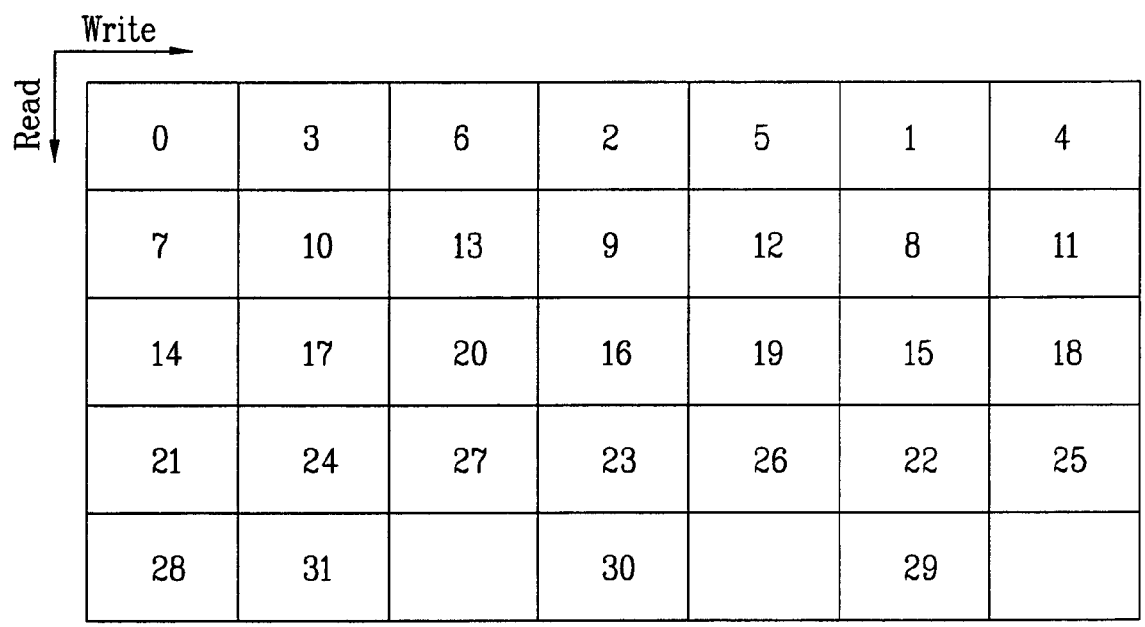
FIG. 2 is a conceptual diagram illustrating a method for performing a regular permutation (RP)
Figure 3A:
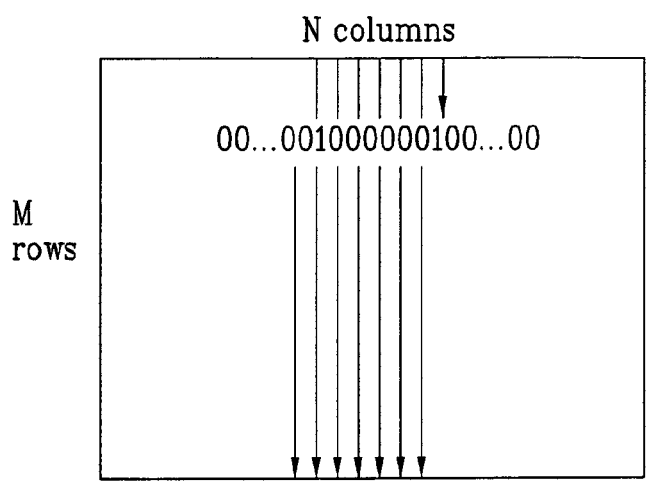
FIG. 3A shows an example of the RTZ (Return-To-Zero) sequence having the weight "2"
Figure 3B:
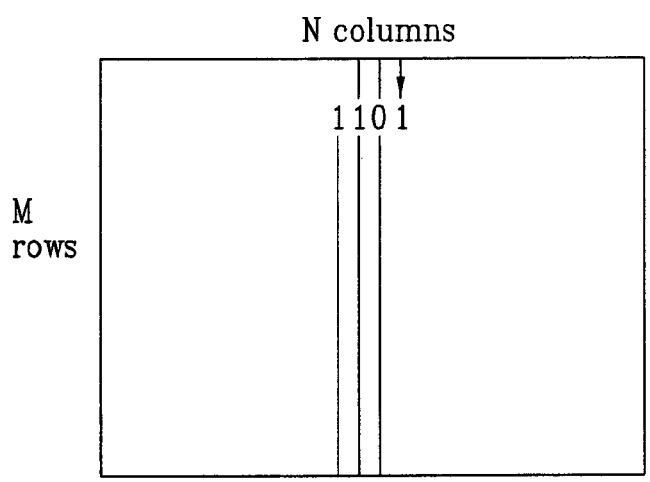
FIG. 3B shows an example of the RTZ (Return-To-Zero) sequence having the weight "3"
Figure 3C:
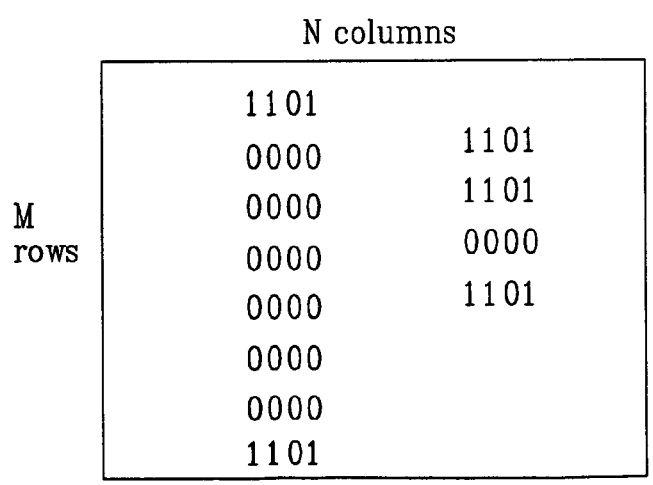
FIG. 3C shows an example of the RTZ (Return-To-Zero) sequence having the weight "6" or "9"
Figure 4:
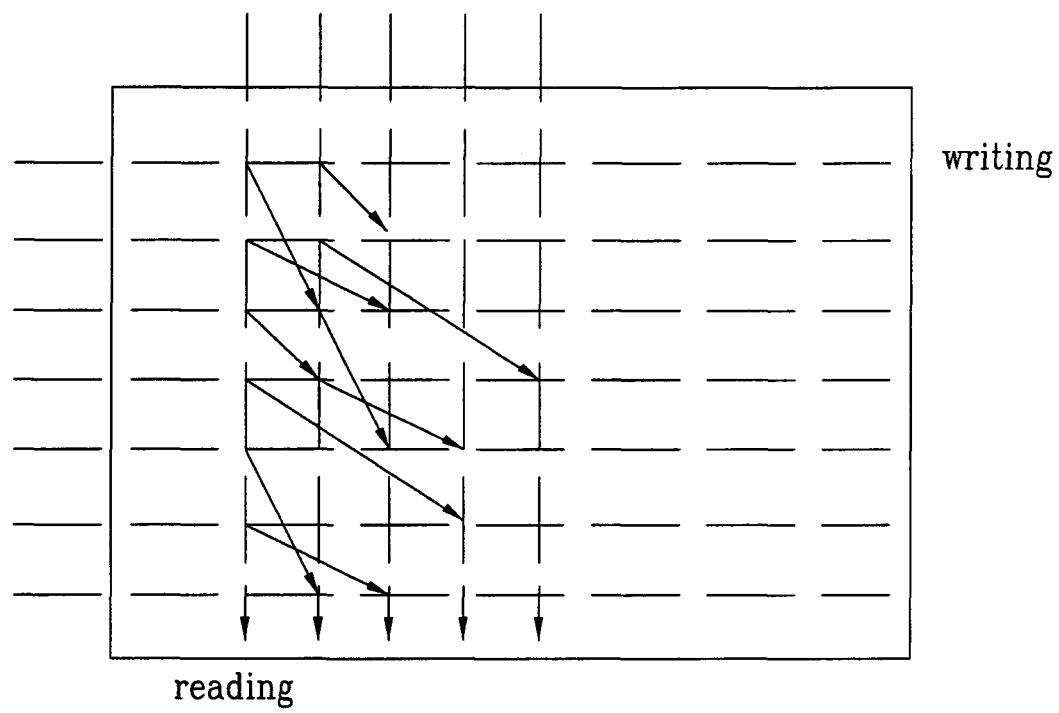
FIG. 4 is a conceptual diagram illustrating the almost regular permutation (ARP) based on the fluctuation vectors according to the present invention.

Differently from FIG. 1, the interleaver 903 of FIG. 9 includes an ARP interleaver 906, a basic-interleaver selection module 904, a dummy insertion module 905, an index mapping module (also called an index mapper) 907. The basic-interleaver selection module 904 selects the basic interleaver having a proper length from among the basic interleaver sets. The dummy insertion module 905 selects an index in which the dummy information is to be inserted, and inserts the dummy information in the selected index. The index mapping module (also called an index mapper) 907 outputs the remaining indexes other than the index equipped with the dummy information, and performs the index mapping if required.

By the above-mentioned components of the interleaver 903, the length sequence instead of the fluctuation-vector period can be ARP-interleaved by the dummy insertion and the removing of the index including the dummy.

In this way, if the length-adjusting modules (e.g., the basic-interleaver selection module 904, the dummy insertion module 905, and the index-removing module 907) are contained in the interleaver 903, the length of each sequence applied to the first and second encoders 901 and 902 has the completed-sequence length having no dummy information. So, even the dummy information is encoded by the first and second encoders 901 and 902, and the parity bit is generated to prevent additional overhead from being generated.

It should be noted that most terminology disclosed in the present invention is defined in consideration of functions of the present invention, and can be differently determined according to intention of those skilled in the art or usual practices. Therefore, it is preferable that the above-mentioned terminology be understood on the basis of all contents disclosed in the present invention.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

INDUSTRIAL APPLICABILITY

As apparent from the above description, the interleaving method according to the present invention can be applied to not only the ARP interleaver but also a predetermined interleaving method having the length denoted by a multiple of a specific length.

The interleaving method uses the interleaver having the length corresponding to a multiple of a specific length, and at the same time interleaves the sequence having a continuous length.

Specifically, the interleaving method performs the pruning process on a predetermined basic interleaver having the length represented by a multiple of the period of the ARP fluctuation vector, so that it can provide the ARP interleaver having a continuous length although the length denoted by the above-mentioned fluctuation-vector period has not been established.

And, the present invention provides the basic interleaver concept, the interleaving method based on the pruning concept, and the turbo-encoder equipped with the interleaver executing the interleaving method, so that it can perform the ARP having a continuous length without generating additional overheads.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An interleaving method comprising:
    inserting dummy information in an original sequence by a predetermined length corresponding to a difference in length between a basic interleaver selected from among a basic interleaver set and the original sequence;
    interleaving the sequence in which the dummy information is inserted using the basic interleaver, the sequence having the length of the basic interleaver;
    removing indexes corresponding to the dummy information from indexes of the interleaved sequence; and
    outputting the interleaved sequence from which the dummy information is removed,
    wherein the basic interleaver has a length represented by a multiple of a specific length,
    wherein the dummy information in the inserting the dummy information is inserted in an arbitrarily-selected position between the original sequences, and
    wherein the arbitrarily-selected position in which the dummy information is inserted includes an initial position of the original sequence.

2. The method according to claim 1, wherein:
    the length of the basic interleaver is a minimum length among lengths which are equal to or longer than the length of the original sequence, and which are represented by the multiple of the specific length.

3. The method according to claim 1, further comprising:
    mapping the index of the outputted sequence according to the index of the original sequence, after the outputting the interleaved sequence.

4. The method according to claim 1, wherein the basic interleaver set is pre-designed to have a length represented by a multiple of an ARP (Almost Regular Permutation) fluctuation-vector period.

5. The method according to claim 4, wherein the specific length is equal to a length of the ARP fluctuation-vector period.

* * * * *